US010181503B2

(12) United States Patent
Lee et al.

(10) Patent No.: US 10,181,503 B2
(45) Date of Patent: Jan. 15, 2019

(54) ORGANIC LIGHT-EMITTING DISPLAY APPARATUS

(71) Applicant: Samsung Display Co., Ltd., Yongin-si, Gyeonggi-do (KR)

(72) Inventors: Dongki Lee, Yongin-si (KR); Jongsung Bae, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/721,288

(22) Filed: Sep. 29, 2017

(65) Prior Publication Data

US 2018/0026087 A1  Jan. 25, 2018

Related U.S. Application Data

(62) Division of application No. 15/147,758, filed on May 5, 2016, now Pat. No. 9,793,332.

(30) Foreign Application Priority Data

Oct. 1, 2015 (KR) ........................ 10-2015-0138613

(51) Int. Cl.
*H01L 29/08* (2006.01)
*H01L 27/32* (2006.01)
(Continued)

(52) U.S. Cl.
CPC ........ *H01L 27/3272* (2013.01); *H01L 27/322* (2013.01); *H01L 27/3211* (2013.01);
(Continued)

(58) Field of Classification Search
CPC ......... H01L 2251/301; H01L 2251/303; H01L 2251/558; H01L 27/3211; H01L 27/322;
(Continued)

(56) References Cited

U.S. PATENT DOCUMENTS 5,554,911 A  9/1996 Nakayama et al.
6,911,772 B2  6/2005 Cok
(Continued)

FOREIGN PATENT DOCUMENTS

KR  10-2010-0059806 A  6/2010
KR  10-2011-0018831 A  2/2011
(Continued)

*Primary Examiner* — Long K Tran

(57) ABSTRACT

An organic light-emitting display apparatus includes a pixel electrode, a light emission layer over the pixel electrode, an opposite electrode covering the light emission layer, a plurality of upper layers over the opposite electrode, a light-shielding layer over the upper layers. A distance L between an edge of an emission area of the light emission layer and an edge of the light-shielding layer when viewed in a thickness direction satisfies Inequality below:

$$L \geq \sum_{i=1}^{m} d_i \tan\left(\sin^{-1}\left(\frac{n_{air}}{n_i}\sin\theta_{air}\right)\right) + d_{BM}\tan\left(\sin^{-1}\left(\frac{n_{air}}{n_{CF}}\sin\theta_{air}\right)\right) \quad \text{[Inequality]}$$

wherein m represents the number of the upper layers, $n_i$ and $d_i$ represent a refraction index and a thickness of each of the upper layers, respectively, $d_{BM}$ represents a thickness of the light-shielding layer, $n_{CF}$ represents a refraction index of the color filter layer, $n_{air}$ represents a refraction index of air, and $\theta_{air}$ represents a refraction angle in external air after light generated from the light emission layer passes through the color filter layer.

3 Claims, 7 Drawing Sheets

(51) Int. Cl.
*H01L 51/00* (2006.01)
*H01L 51/52* (2006.01)

(52) U.S. Cl.
CPC ...... *H01L 27/3246* (2013.01); *H01L 51/0034* (2013.01); *H01L 51/0035* (2013.01); *H01L 51/5256* (2013.01); *H01L 51/5275* (2013.01); *H01L 51/5284* (2013.01); *H01L 2251/301* (2013.01); *H01L 2251/303* (2013.01); *H01L 2251/558* (2013.01)

(58) Field of Classification Search
CPC ............ H01L 27/3246; H01L 27/3272; H01L 51/0034; H01L 51/0035; H01L 51/50; H01L 51/5256
USPC ......................................................... 257/40
See application file for complete search history.

(56) References Cited

U.S. PATENT DOCUMENTS

| | | | |
|---|---|---|---|
| 7,521,722 | B2 | 4/2009 | Yamazaki et al. |
| 2007/0085075 | A1 | 4/2007 | Yamazaki et al. |
| 2008/0008905 | A1 | 1/2008 | Yamazaki |
| 2011/0043096 | A1 | 2/2011 | Asaki |
| 2011/0220924 | A1 | 9/2011 | Fukuda |
| 2014/0062294 | A1 | 3/2014 | Toyoda et al. |
| 2014/0231790 | A1 | 8/2014 | Fujino |

FOREIGN PATENT DOCUMENTS

| | | |
|---|---|---|
| KR | 10-2012-0122534 A | 7/2012 |
| KR | 10-2014-0029238 A | 3/2014 |
| KR | 10-2014-0083143 A | 7/2014 |
| KR | 10-2014-0083988 A | 7/2014 |

ORGANIC LIGHT-EMITTING DISPLAY APPARATUS

CROSS-REFERENCE TO RELATED APPLICATION

This application is a divisional of U.S. patent application Ser. No. 15/147,758, filed May 5, 2016, which claims priority under 35 U.S.C. § 119 of Korean Patent Application No. 10-2015-0138613, filed on Oct. 1, 2015, in the Korean Intellectual Property Office, the disclosures of which are incorporated by reference herein in their entireties.

BACKGROUND

1. Field

One or more embodiments relate to an organic light-emitting display apparatus, and more particularly, to an organic light-emitting display apparatus with improved extraction efficiency of light.

2. Discussion of the Related Technology

In a general top-emission type organic light-emitting display apparatus, light emitted from an emission layer passes through a cathode, layers above the cathode, and is emitted externally. As the light emitted from the light emission layer passes through various layers, refraction of light may occur at interfaces and an optical path is determined accordingly.

SUMMARY

However, from among light emitted from an emission layer of a typical organic light-emitting display apparatus, a large proportion of light is not externally emitted. This leads to brightness reduction, and thus increases power consumption to increase brightness.

Thus, one or more embodiments are directed to an organic light-emitting display apparatus with improved extraction efficiency of light.

Additional aspects will be set forth in part in the description which follows and, in part, will be apparent from the description, or may be learned by practice of the presented embodiments.

One aspect of the invention provides an organic light-emitting display apparatus, which may comprise: a pixel electrode disposed over a substrate; a light emission layer disposed over the pixel electrode; an opposite electrode covering the light emission layer; a plurality of upper layers disposed over the opposite electrode, wherein the number of the plurality of upper layers is m which represents a natural number greater than one; a light-shielding layer disposed over the plurality of upper layers, the light-shielding layer not overlapping the light emission layer; and a color filter layer disposed over the upper layers, wherein L is defined by a distance between an edge of an emission area of the light emission layer and an edge of the light-shielding layer when viewed in a viewing direction perpendicular to a major surface of the substrate, wherein the distance L satisfies Inequality below:

$$L \geq \sum_{i=1}^{m} d_i \tan\left(\sin^{-1}\left(\frac{n_{air}}{n_i}\sin\theta_{air}\right)\right) + d_{BM}\tan\left(\sin^{-1}\left(\frac{n_{air}}{n_{CF}}\sin\theta_{air}\right)\right)$$ [Inequality]

wherein $n_i$ represents a refraction index of each of the upper layers, $d_i$ represents a thickness of each of the upper layers, $d_{BM}$ represents a thickness of the light-shielding layer, $n_{CF}$ represents a refraction index of the color filter layer, $n_{air}$ represents a refraction index of air, and $\theta_{air}$ represents a refraction angle in external air after light generated from the light emission layer passes through the color filter layer.

In the foregoing apparatus, the display apparatus may further comprise a pixel-defining layer covering a boundary of the pixel electrode such that a central area of the pixel electrode is exposed through a hole defined by the pixel-defining layer. The emission area of the light emission layer may correspond to an area of the pixel electrode, which is not covered by the pixel-defining layer. The edge of the emission area of the light emission layer may correspond to a boundary of the area of the pixel electrode, which is not covered by the pixel-defining layer. The display apparatus may further comprise a pixel-defining layer disposed over the substrate and defining a hole that allows a portion of the light emission layer not to overlap the pixel-defining layer when viewed in the viewing direction, wherein the emission area is defined by the non-overlapping portion of the light emission layer.

Still in the foregoing apparatus, a lowermost layer among the plurality of upper layers may directly contact the opposite electrode. A bottom surface of the color filter layer facing the light emission layer and a bottom surface of the light-shielding layer facing the light emission layer may be on the same plane. A thickness of the color filter layer may be substantially equal to or substantially greater than a thickness of the light-shielding layer. $\theta_{air}$ may be 90°. The plurality of upper layers may comprise a first inorganic encapsulating layer, an organic encapsulating layer on the first inorganic encapsulating layer, and a second inorganic encapsulating layer on the organic encapsulating layer. Each of the first inorganic encapsulating layer and the second inorganic encapsulating layer may comprise at least one selected from silicon oxide, silicon nitride, and silicon oxynitride, and the organic encapsulating layer may comprise at least one selected from polyacrylate, polyethylene terephthalate, polyethylene naphthalate, polycarbonate, polyimide, polyethylene sulfonate, polyoxymethylene, and polyarylate. The organic encapsulating layer may be disposed between and directly contact both the first and second inorganic encapsulating layers.

Yet in the foregoing apparatus, the plurality of upper layers may comprise a plurality of inorganic encapsulating layers and a plurality of organic encapsulating layers which are alternatively stacked on one another. Each of the inorganic encapsulating layers may comprise at least one selected from silicon oxide, silicon nitride, and silicon oxynitride, and each of the organic encapsulating layers may comprise at least one selected from polyacrylate, polyethylene terephthalate, polyethylene naphthalate, polycarbonate, polyimide, polyethylene sulfonate, polyoxymethylene, and polyarylate.

The edge of the light-shielding layer may define an opening through which light emitted from the light emission layer toward the upper layers travels, wherein the edge of the light-shielding layer forms a closed loop surrounding the emission area of the light emission layer when viewed in the viewing direction. The edge of the light-shielding layer may define an opening, wherein the distance L is defined to satisfy said Inequality such that substantially the entire portion of light emitted from the light emission layer toward the upper layers travels through the opening. The edge of the light-shielding layer may face the edge of the emission area of the light emission layer when viewed in the viewing direction.

Another aspect of the invention provides an organic light-emitting display apparatus, which may comprise: an array of pixels disposed over a substrate, each pixel comprising a first sub-pixel comprising a first light emission layer configured to emit first light having a first wavelength within a first wavelength range, a second sub-pixel comprising a second light emission layer configured to emit second light having a second wavelength within a second wavelength range, the second wavelength of the second light being longer than a wavelength of light within the first wavelength range, and a third sub-pixel comprising a third light emission layer configured to emit third light having a third wavelength within a third wavelength range, the third wavelength of the third light being longer than a wavelength of light within the second wavelength range; an encapsulating layer disposed over the first to third sub-pixels; a light-shielding layer disposed over the encapsulating layer; and a color filter layer disposed on the encapsulating layer, wherein L1<L2<L3 is satisfied when L1 represents a distance between an edge of an emission area of the first light emission layer and a first edge of the light-shielding layer when viewed in a viewing direction perpendicular to a major surface of the substrate, L2 represents a distance between an edge of an emission area of the second light emission layer and a second edge of the light-shielding layer when viewed in the viewing direction, and L3 represents a distance between an edge of an emission area of the third light emission layer and a third edge of the light-shielding layer when viewed in the viewing direction.

In the foregoing apparatus, the first edge of the light-shielding layer may define an opening through which light emitted from the first light emission layer travels, wherein the distance L1 is determined such that substantially the entire amount of the light emitted from the first light emission layer toward the encapsulation layer travels through the opening. The first edge may form a first closed loop surrounding the emission area of the first light emission layer, wherein the second edge may form a second closed loop surrounding the emission area of the second light emission layer, wherein the third edge may form a third closed loop surrounding the emission area of the third light emission layer.

According to one or more embodiments, an organic light-emitting display apparatus includes a pixel electrode, an emission layer over the pixel electrode, an opposite electrode covering the emission layer, m number of upper layers over the opposite electrode, a light-shielding layer over the upper layers, the light-shielding layer not overlapping the emission layer, and a color filter layer over the upper layers. A distance L between an edge of an emission area of the emission layer toward the light-shielding layer and an edge of the light-shielding layer toward the emission layer satisfies Inequality below:

$$L \geq \sum_{i=1}^{m} d_i \tan\left(\sin^{-1}\left(\frac{n_{air}}{n_i}\sin\theta_{air}\right)\right) + d_{BM} \tan\left(\sin^{-1}\left(\frac{n_{air}}{n_{CF}}\sin\theta_{air}\right)\right) \quad \text{[Inequality]}$$

wherein $n_i$ represents a refraction index of each of the upper layers, $d_i$ represents a thickness of each of the upper layers, $d_{BM}$ represents a thickness of the light-shielding layer, $n_{CF}$ represents a refraction index of the color filter layer, $n_{air}$ represents a refraction index of air, and $\theta_{air}$ represents a refraction angle in external air after light generated from the emission layer passes through the color filter layer.

The organic light-emitting display apparatus may further include a pixel-defining layer covering a boundary of the pixel electrode such that a central area of the pixel electrode is exposed, and the upper layers may correspond to the pixel electrode and the pixel-defining layer.

The emission area of the emission layer may correspond to an area of the pixel electrode, which is not covered by the pixel-defining layer. The edge of the emission area of the emission layer toward the light-shielding layer may correspond to a boundary of the area of the pixel electrode, which is not covered by the pixel-defining layer.

A lowermost layer toward the emission layer, from among the m number of upper layers, may directly contact the opposite electrode.

A bottom surface of the color filter layer toward the emission layer and a bottom surface of the light-shielding layer toward the emission layer may be on a same plane. A thickness of the color filter layer may be equal to or greater than a thickness of the light-shielding layer.

$\theta_{air}$ may be 90°.

The m number of upper layers may include a first inorganic encapsulating layer, an organic encapsulating layer on the first inorganic encapsulating layer, and a second inorganic encapsulating layer on the organic encapsulating layer. Each of the first inorganic encapsulating layer and the second inorganic encapsulating layer may include at least one selected from silicon oxide, silicon nitride, and silicon oxynitride. The organic encapsulating layer may include at least one selected from polyacrylate, polyethylene terephthalate, polyethylene naphthalate, polycarbonate, polyimide, polyethylene sulfonate, polyoxymethylene, and polyarylate.

The m number of upper layers may include a plurality of inorganic encapsulating layers and a plurality of organic encapsulating layers which are alternatively stacked on one another. Each of the inorganic encapsulating layers may include at least one selected from silicon oxide, silicon nitride, and silicon oxynitride. Each of the organic encapsulating layers may include at least one selected from polyacrylate, polyethylene terephthalate, polyethylene naphthalate, polycarbonate, polyimide, polyethylene sulfonate, polyoxymethylene, and polyarylate.

According to one or more embodiments, an organic light-emitting display apparatus includes a first sub-pixel comprising a first emission layer emitting first light having wavelength belonging to a first wavelength band, a second sub-pixel comprising a second emission layer emitting second light having wavelength belonging to a second wavelength band, the wavelength of the second light being longer than wavelength of light belong to the first wavelength band, a third sub-pixel comprising a third emission layer emitting third light having wavelength belonging to a third wavelength band, the wavelength of the third light being longer than wavelength of light belonging to the second wavelength band, an encapsulating layer over the first to third sub-pixels, a light-shielding layer over the encapsulating layer and corresponding to areas between the first to third sub-pixels, and a color filter layer on the encapsulating layer. L1<L2<L3 is satisfied when L1 represents a distance between an edge of an emission area of the first emission layer toward the light-shielding layer and an edge of the light-shielding layer toward the first emission layer, L2 represents a distance between an edge of an emission area of the second emission layer toward the light-shielding layer and an edge of the light-shielding layer toward the second emission layer, and L3 represents a distance between an edge of an emission area of the third emission layer toward the light-shielding layer and an edge of the light-shielding layer toward the third emission layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
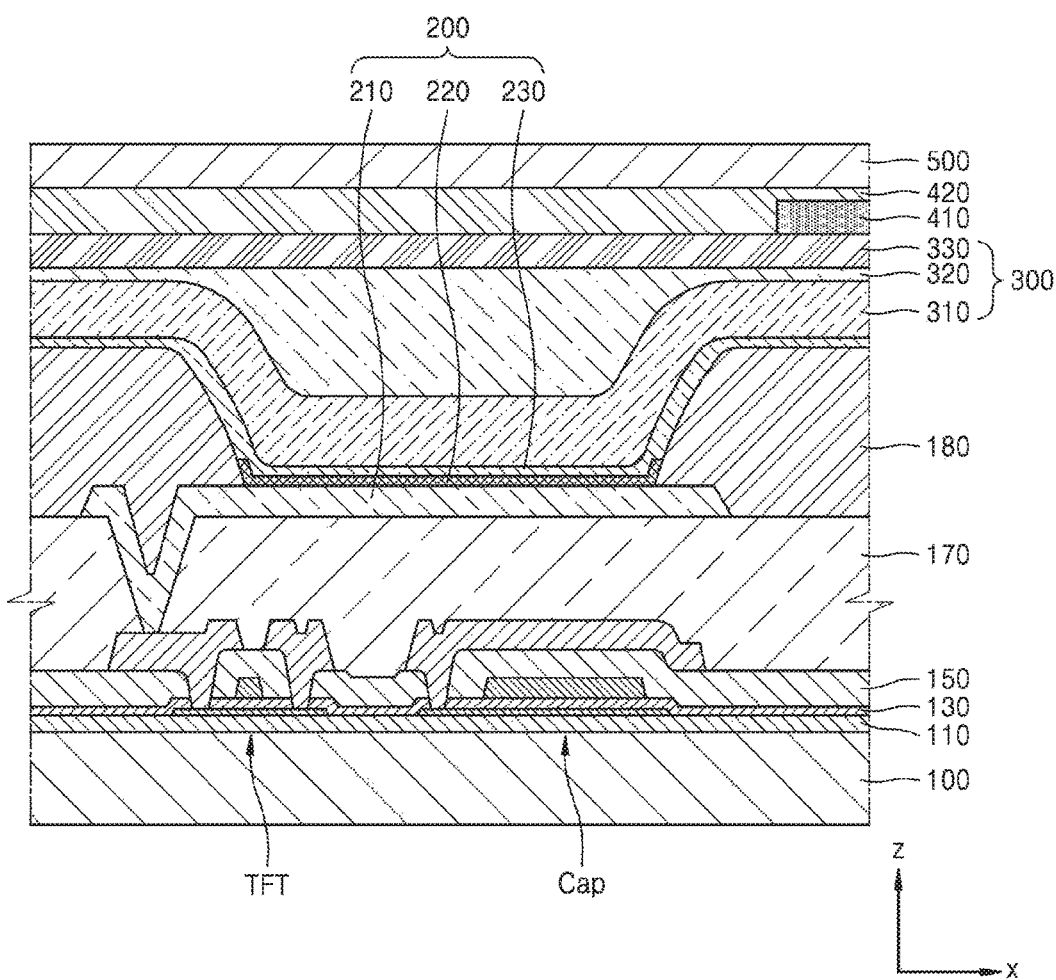
FIG. 1 is a cross-sectional view schematically illustrating a portion of an organic light-emitting display apparatus according to an embodiment and FIG. 7 is a cross-sectional view schematically illustrating multiple sub-pixels of one pixel of the organic light-emitting display apparatus of FIG. 1.

As the inventive concept allows for various changes and numerous embodiments, particular embodiments will be illustrated in the drawings and described in the written description. The effect and features of the inventive concept and the method of realizing the effect and the features will be clear with reference to the embodiments described below with reference to the drawings. However, the inventive concept may be embodied in various forms and should not be construed as being limited to the embodiments. As used herein, the term "and/or" includes any and all combinations of one or more of the associated listed items. Expressions such as "at least one of," when preceding a list of elements, modify the entire list of elements and do not modify the individual elements of the list.

Hereinafter, the embodiments will be described with reference to the drawings. Like reference numerals refer to like elements in the drawings, and thus, descriptions of similar or identical elements will not be repeated.

It will be understood that when a layer, region, or component is referred to as being formed or disposed "on," another layer, region, or component, it can be formed or disposed directly on and contact the other layer, region, or component, or it can be formed or disposed indirectly on the other layer, region or component such that one or more intervening layers, regions or components may be present therebetween.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

FIG. 1 is a cross-sectional view schematically illustrating a portion of an organic light-emitting display apparatus according to an embodiment;

The organic light-emitting display apparatus according to the present embodiment includes a pixel electrode 210, an emission layer 220 over the pixel electrode 210, four upper layers, namely, an opposite electrode 230, a first inorganic encapsulating layer 310, an organic encapsulating layer 320, and a second inorganic encapsulating layer 330 over the light emission layer 220, a light-shielding layer 410 over the upper layers 230, 310, 320, and 330, and a color filter layer 420 over the upper layers 230, 310, 320, and 330.

When necessary, as shown in FIG. 1, a thin film transistor TFT or a capacitor Cap may be provided on a substrate 100, and the pixel electrode 210 may be electrically connected to the thin film transistor TFT. The substrate 100 may include various materials, for example, a glass material, a metallic material, or a plastic material such as polyethylene terephthalate (PET), polyethylene naphthalate (PEN), and polyimide. Also, a buffer layer 110, a gate insulating layer 130, an interlayer insulating layer 150, and a planarization layer 170 may be provided on the substrate 100. The buffer layer 110 may prevent impurities from penetrating into a semiconductor layer of the thin film transistor TFT. The gate insulating layer 130 may insulate the semiconductor layer of the thin film transistor TFT from a gate electrode. The interlayer insulating layer 150 may insulate a source/drain electrode and the gate electrode of the thin film transistor TFT from each other. The planarization layer 170 may cover the thin film transistor TFT and have a substantially flat top surface.

The pixel electrode 210 may be a (semi) transparent electrode or a reflection electrode. When the pixel electrode 210 is a (semi) transparent electrode, the pixel electrode 210 may include, for example, indium tin oxide (ITO), indium zinc oxide (IZO), zinc oxide ZnO), indium oxide ($In_2O_3$), indium gallium oxide (IGO), or aluminum zinc oxide (AZO). When the pixel electrode 210 is a reflection electrode, the pixel electrode 210 may include a reflection layer including silver (Ag), magnesium (Mg), aluminum (Al), platinum (Pt), palladium (Pd), gold (Au), nickel (Ni), neodymium (Nd), iridium (Ir), chrome (Cr), or a compound thereof, and a layer including ITO, IZO, ZnO, or $In_2O_3$. However, composition and materials of the pixel electrode 210 are not limited to the above and various modifications may be adapted.

In order to define a location of the light emission layer 220 among layers above the pixel electrode 210, a pixel-defining layer 180 may be provided as shown in FIG. 1. The pixel-defining layer 180 may cover a boundary of the pixel electrode 210 such that a central area of the pixel electrode 210 is exposed. Accordingly, the pixel-defining layer 180 may define a pixel. Also, the pixel-defining layer 180 may increase a distance between an edge of the pixel electrode 210 and the opposite electrode 230 above the pixel electrode 210 so as to prevent an arc at the edge of the pixel electrode 210.

The light emission layer 220 is located on the pixel electrode 210. An intermediate layer may be provided between the pixel electrode 210 and the light emission layer 220. For example, a hole injection layer and/or a hole transport layer may be provided on the pixel electrode 210, and the light emission layer 220 may be provided on the hole injection layer and/or the hole transport layer.

As shown in FIG. 1, the opposite electrode 230 is located on the light emission layer 220. The opposite electrode 230 may be integrally formed as one body so that one opposite electrode 230 may correspond to a plurality of pixels. Therefore, the opposite electrode 230 may correspond to not only the light emission layer 220 but also top surfaces of the pixel-defining layer 180. The opposite electrode 230 may be a (semi) transparent electrode. Accordingly, the opposite electrode 230 may include a layer including lithium (Li), calcium (Ca), LiF/Ca, LiF/Al, Al, Mg, or a compound thereof, and a layer including a (semi) transparent material such as ITO, IZO, ZnO, or $In_2O_3$.

The pixel electrode 210, the light emission layer 220, and the opposite electrode 230 may be regarded as an organic light-emitting device (OLED) 200. The OLED 200 may emit light having brightness that is determined according to an electric signal applied to the pixel electrode 210 via the thin film transistor TFT.

An encapsulation layer 300 is provided on the OLED 200. The encapsulation layer 300 may not only correspond to the light emission layer 220 but also the top surfaces of the pixel-defining layer 180. The encapsulation layer 300 may have a multi-layer structure. For example, the encapsulation layer 300 may include the first inorganic encapsulating layer 310, the organic encapsulating layer 320, and the second inorganic encapsulating layer 330, as shown in FIG. 1. The encapsulation layer 300 may protect the OLED 200 from external impurities such as oxygen or moisture.

The first inorganic encapsulating layer 310 or the second inorganic encapsulating layer 330 may include various materials, for example, silicon nitride, silicon oxide, and/or silicon oxynitride, or metal oxide, metal nitride, metal oxynitride, or metal carbide. The organic encapsulating layer 320 between the first and second inorganic encapsulating layers 310 and 330 may planarize curves of the first inorganic encapsulating layer 310. Also, since organic encapsulating layer 320 covers the first inorganic encapsulating layer 310, even when there is a crack in the first inorganic encapsulating layer 310, the crack may not extend further into the second inorganic encapsulating layer 330. The organic encapsulating layer 320 may include at least one selected from the group consisting of polyacrylate, PET, PEN, polycarbonate, polyimide, polyethylene sulfonate, polyoxymethylene, and polyarylate.

The light-shielding layer 410 and the color filter layer 420 are provided on the encapsulation layer 300. The light-shielding layer 410 is provided on the encapsulation layer 300 without overlapping the light emission layer 220, and the color filter layer 420 is provided on the encapsulation layer 300 and overlaps the light emission layer 220. Since the light-shielding layer 410 does not overlap the light emission layer 220, the light-shielding layer 410 may be regarded as being located correspondingly to areas between pixels. For example, when viewing the organic light-emitting display apparatus on z-axis that is perpendicular to an xy-plane and extends in a direction of perpendicular to a major surface of the substrate 100 or a thickness direction of the display apparatus, the light-shielding layer 410 may surround each of the pixels. The light-shielding layer 410 may be regarded as surrounding an emission area of the light emission layer 220.

The light-shielding layer 410 may prevent external light reflection and increase contrast of the organic light-emitting display apparatus. The light-shielding layer 410 may include a material such as Cr, Al, silicon (Si), or an oxide thereof. The color filter layer 420 may restrict a wavelength of light to be emitted externally, from among light generated by the light emission layer 220, within a predetermined wavelength band, or may prevent a portion of external light, which is incident on the color filter layer 420 and does not belong to the predetermined wavelength band, from being reflected externally.

Since the light-shielding layer 410 and the color filter layer 420 are located on the encapsulation layer 300, a bottom surface of the light-shielding layer 410 facing the light emission layer 220 (−z direction) and a bottom surface of the color filter layer 420 facing the light emission layer 220 (−z direction) may be on the same plane. In this case, the color filter layer 420 may be thicker than the light-shielding layer 410, as shown in FIG. 1, and thus, the color filter layer 420 may cover the an upper surface of the light-shielding layer 410. However, the embodiments are not limited thereto, and the color filter layer 420 may be as thick as the light-shielding layer 410.

The organic light-emitting display apparatus according to the present embodiment may further include a window 500. The window 500 is a transparent layer and be located at an outermost area of the organic light-emitting display apparatus.

Hereinafter, an optical path in the organic light-emitting display apparatus according to the present embodiment will be described.

Figure 2:
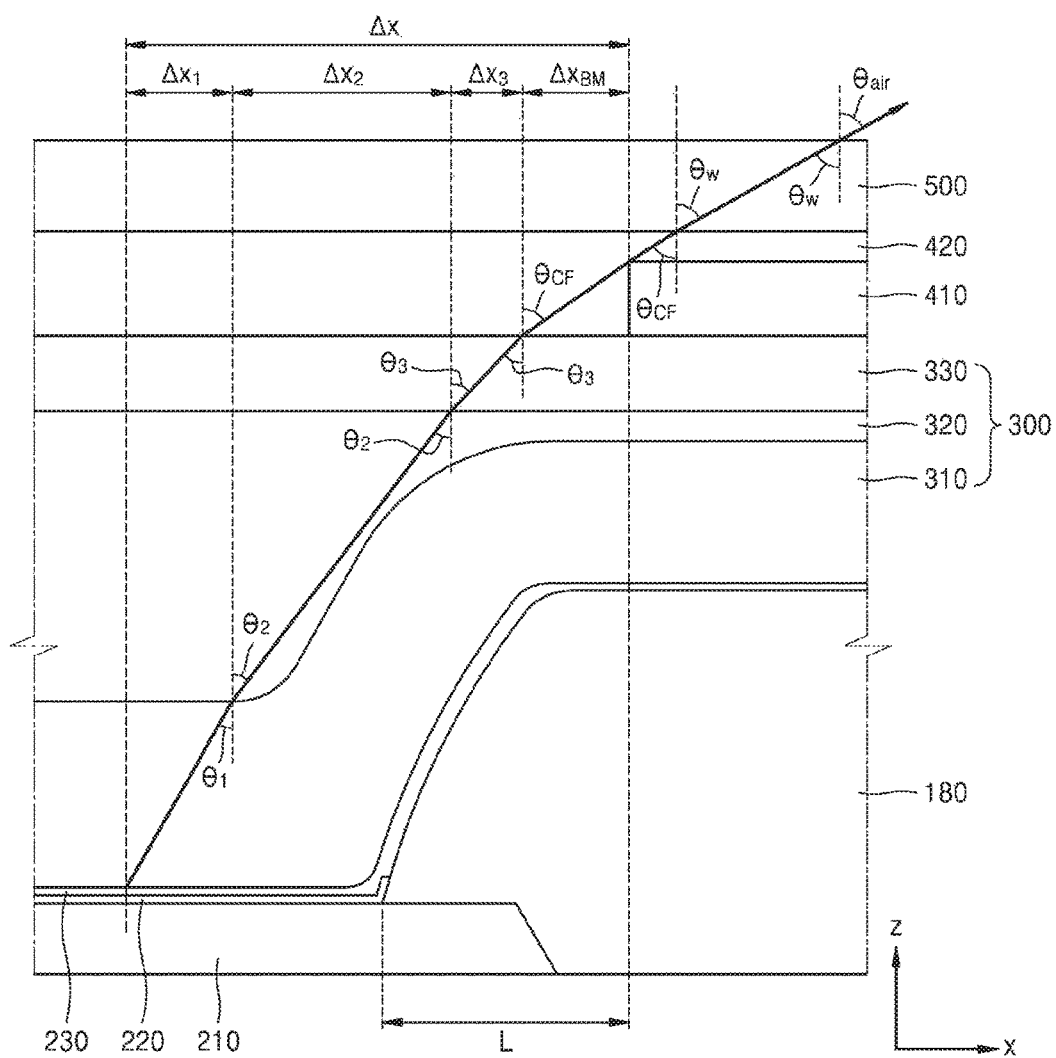
FIG. 2 is a conceptual view schematically illustrating an optical path in the portion of the organic light-emitting display apparatus of FIG. 1.

FIG. 2 is a conceptual view schematically illustrating an optical path in the portion of the organic light-emitting display apparatus of FIG. 1. FIG. 2 shows a sectional view taken along a plane which is perpendicular to a major surface of a substrate of the display apparatus. Although FIG. 2 shows that the organic light-emitting display apparatus according to the present embodiment does not satisfy the condition of Inequality 9 shown below, this is only for convenience of description and illustration. As shown in FIG. 2, light emitted by the light emission layer 220 passes through the opposite electrode 230, the encapsulation layer 300, the color filter layer 420, and the window 500 and is emitted externally. In this case, refraction occurs at interfaces based on Snell's law.

In this case, the opposite electrode 230 may have a thickness of only few nm (nanometer) to tens of nm, whereas the encapsulation layer 300 and the light-shielding layer 410 may be much thicker than the opposite electrode 230, e.g., about few μm. An electron transport layer and/or an electron injection layer may be provided between the light emission layer 220 and the opposite electrode 230. However, the light emission layer 220, the electron transport layer, and the electron injection layer may have a thickness of only few nm to tens of nm.

Hereinafter, with regard to an optical path, by which light generated by the light emission layer 220 travels before being externally emitted, a displacement in a direction (+x direction) perpendicular to a forward direction (+z direction) that is perpendicular to the pixel electrode 210 will be described. Since the light emission layer 220, the electron transport layer, and the electron injection layer have a thickness of only few nm to tens of nm, when describing the displacement in the direction (+x direction) in which light generated by the light emission layer 220 travels until being externally emitted, it is acceptable to only consider a displacement in the encapsulation layer 300 and disregard a displacement in the electron transport layer and/or the electron injection layer, or the opposite electrode 230.

A refraction index of the first inorganic encapsulating layer 310 may be indicated by '$n_1$,' a refraction index of the organic encapsulating layer 320 may be indicated by '$n_2$,' a refraction index of the second inorganic encapsulating layer 330 may be indicated by '$n_3$,' a refraction index of the color filter layer 420 may be indicated by '$n_{CF}$,' a refraction index of the window 500 may be indicated by '$n_w$.' Light incident angle at an interface between the first inorganic encapsulating layer 310 and the organic encapsulating layer 320 is indicated by '$\theta_1$,' a light refraction angle at the interface is indicated by '$\theta_2$,' a light refraction angle at an interface between the organic encapsulating layer 320 and the second inorganic encapsulating layer 330 is indicated by '$\theta_3$,' a light refraction angle at an interface between the second inorganic encapsulating layer 330 and the color filter layer 420 is indicated by '$\theta_{CF}$,' a light refraction angle at an interface between the color filter layer 420 and the window 500 is indicated by '$\theta_w$,' and a light refraction angle at an interface between the window 500 and external air is indicated by '$\theta_{air}$.' The relationship between the indices and angles at the interfaces may be as defined below in Equation 1 based on Snell's law (wherein i is 1 or 2).

$$n_i \sin \theta_i = n_{i+1} \sin \theta_{i+1}, \; n_3 \sin \theta_3 = n_{CF} \sin \theta_{CF}$$

$$n_{CF} \sin \theta_{CF} = n_w \sin \theta_w, \; n_w \sin \theta_w = n_{air} \sin \theta_{air} \quad \text{[Equation 1]}$$

Equation 2 may be derived based on a relation of the interface between the window 500 and external air in Equation 1.

$$n_w = n_{air} \frac{\sin \theta_{air}}{\sin \theta_w} \quad \text{[Equation 2]}$$

Also, Equation 3 may be derived based on the relation of the interface between the color filter layer 420 and the window 500 in Equation 1 and Equation 2.

$$n_{CF} = n_w \frac{\sin \theta_w}{\sin \theta_{CF}} = n_{air} \frac{\sin \theta_{air}}{\sin \theta_{CF}}, \quad \text{[Equation 3]}$$

$$\theta_{CF} = \sin^{-1}\left(\frac{n_{air}}{n_{CF}} \sin \theta_{air}\right)$$

Likewise, Equation 4 may be derived based on the relation of the interface between the second inorganic encapsulating layer 330 and the color filter layer 420 in Equation 1 and Equation 3.

$$n_3 = n_{CF} \frac{\sin \theta_{CF}}{\sin \theta_3} = n_{air} \frac{\sin \theta_{air}}{\sin \theta_3}, \quad \text{[Equation 4]}$$

$$\theta_4 = \sin^{-1}\left(\frac{n_{air}}{n_4} \sin \theta_{air}\right)$$

Also, Equation 5 may be derived based on the relation of the interface between the first inorganic encapsulating layer 310 and the organic encapsulating layer 320 and the relation of the interface between the organic encapsulating layer 320 and the second inorganic encapsulating layer 330 in Equation 1 and Equation 4 (wherein i is 1 or 2).

$$n_i = n_{i+1} \frac{\sin \theta_{i+1}}{\sin \theta_i} = n_{air} \frac{\sin \theta_{air}}{\sin \theta_i}, \quad \text{[Equation 5]}$$

$$\theta_i = \sin^{-1}\left(\frac{n_{air}}{n_i} \sin \theta_{air}\right)$$

A distance traveled by light in the first inorganic encapsulating layer 310 in a direction (+x direction) perpendicular to a direction (+z direction) perpendicular to the pixel electrode 210 is indicated by $\Delta x_1$; a distance traveled by light in the organic encapsulating layer 320 in the direction (+x direction) perpendicular to the forward direction (+z direction) is indicated by $\Delta x_2$; a distance traveled by light in the second inorganic encapsulating layer 330 in the direction (+x direction) perpendicular to the forward direction (+z direction) is indicated by $\Delta x_3$; and a distance traveled by light in the forward direction (+z direction) in the color filter layer 420 by a thickness of the light-shielding layer 410 in the direction (+x direction) perpendicular to the forward direction (+z direction) is indicated by $\Delta x_{BM}$. Then, a total distance $\Delta x$ traveled by light in a direction perpendicular to the forward direction (+z direction) is as defined below in Equation 6.

$$\Delta x = \sum_{i=1}^{3} \Delta x_i + \Delta x_{BM} = \sum_{i=1}^{3} d_i \tan \theta_i + d_{BM} \tan \theta_{CF} \quad \text{[Equation 6]}$$

Equation 7 is derived by substituting Equations 3 to 5 into Equation 6.

$$\Delta x = \sum_{i=1}^{3} d_i \tan\left(\sin^{-1}\left(\frac{n_{air}}{n_i} \sin \theta_{air}\right)\right) + d_{BM} \tan\left(\sin^{-1}\left(\frac{n_{air}}{n_{CF}} \sin \theta_{air}\right)\right) \quad \text{[Equation 7]}$$

Heretofore, an example in which three layers are provided between the opposite electrode 230 and the color filter layer 420 has been described. In embodiments, a plurality of upper layers may be provided on the opposite electrode 230 and the color filter layer 420 may be above the upper layers. In this case, Equation 7 may be modified as below in Equation 8 (wherein the number of the plurality of upper layers is represented by m which is a natural number of at least 1).

$$\Delta x = \sum_{i=1}^{m} d_i \tan\left(\sin^{-1}\left(\frac{n_{air}}{n_i} \sin \theta_{air}\right)\right) + d_{BM} \tan\left(\sin^{-1}\left(\frac{n_{air}}{n_{CF}} \sin \theta_{air}\right)\right) \quad \text{[Equation 8]}$$

In this case, suppose that 'L' represents a distance between an edge of the emission area of the light emission layer 220 in the direction (+x direction) which faces the light-shielding layer 410 and an edge of the light-shielding layer 410 in a direction (−x direction) which faces the light emission layer 220. Then, the organic light-emitting display apparatus according to the present embodiment satisfies the following Inequality 9.

$$L \geq \sum_{i=1}^{m} d_i \tan\left(\sin^{-1}\left(\frac{n_{air}}{n_i} \sin \theta_{air}\right)\right) + d_{BM} \tan\left(\sin^{-1}\left(\frac{n_{air}}{n_{CF}} \sin \theta_{air}\right)\right) \quad \text{[Inequality 9]}$$

When L does not satisfy Inequality 9, this indicates that at least some of the light generated at the edge of the emission area of the light emission layer 220 in the direction (+x direction) toward the light-shielding layer 410 is blocked by the light-shielding layer 410 and not emitted externally, thereby decreasing light efficiency.

However, L may satisfy Inequality 9 in the organic light-emitting display apparatus according to the present embodiment, and thus, extraction efficiency of light generated by the emission area of the light emission layer 220 may substantially increase. In this case, the emission area of the light emission layer 220 may correspond to an area of the pixel electrode 210, which is not covered by the pixel-defining layer 180. Also, the edge of the emission area of the light emission layer 220 in the direction (+x direction) toward the light-shielding layer 410 may be regarded as a portion of the light emission layer 220, which corresponds to a boundary of the area of the pixel electrode 210, which is not covered by the pixel-defining layer 180.

According to the above description, the encapsulation layer 300 includes three layers, i.e., the first inorganic encapsulating layer 310, the organic encapsulating layer 320, and the second inorganic encapsulating layer 330. In embodiments, the plurality of upper layers include the first inorganic encapsulating layer 310, the organic encapsulating layer 320 on the first inorganic encapsulating layer 310, and the second inorganic encapsulating layer 330 on the organic encapsulating layer 320. However, the embodiments are not limited thereto. For example, the plurality of upper layers may include a plurality of inorganic encapsulating layers and a plurality of organic encapsulating layers which are alternatively stacked on one another. Each of the inorganic encapsulating layers may include at least one selected from silicon oxide, silicon nitride, and silicon oxynitride, and each of the organic encapsulating layers may include at least one selected from polyacrylate, PET, PEN, polycarbonate, polyimide, polyethylene sulfonate, polyoxymethylene, and polyarylate.

From among the plurality of upper layers described in relation to Inequality 9, the lowermost layer in the direction (−z direction) facing the light emission layer 220 may directly contact the opposite electrode 230. In embodiments, other layers such as a capping layer or a film layer may be provided between the opposite electrode 230 and the encapsulation layer 300. In this case, the plurality of upper layers may be regarded as including the encapsulation layer 300 and other layers, e.g., a capping layer or a film layer. Also, when other layers are between the encapsulation layer 300 and the color filter layer 420, the other layers are also included in the plurality of upper layers described above in relation to Inequality 9.

With regard to Inequality 9, 'L' is a function of respective thicknesses and refraction indices of the plurality of upper layers, a thickness of the light-shielding layer 410, a refraction index of the color filter layer 420, a refraction index of air, and a final refraction angle. In embodiments, whether other layers, such as a touch screen layer, are provided between the color filter layer 420 and the window 500 and whether an air layer is provided between the color filter layer 420 and the window 500 do not affect 'L.' Therefore, even when other layers, such as a touch screen layer, or the air layer is provided between the color filter layer 420 and the window 500, as long as Inequality 9 is satisfied, the organic light-emitting display apparatus is within the scope of the present inventive concept.

When '$\theta_{air}$' is 90°, the organic light-emitting display apparatus has a very wide viewing angle. In this case, Inequality 9 may be modified as below in Inequality 10.

$$L \geq \sum_{i=1}^{m} d_i \tan\left(\sin^{-1}\left(\frac{n_{air}}{n_i}\right)\right) + d_{BM} \tan\left(\sin^{-1}\left(\frac{n_{air}}{n_{CF}}\right)\right)$$ [Inequality 10]

Also, when the refraction index of air is equal to 1, Inequality 10 may be modified as below in Inequality 11.

$$L \geq \sum_{i=1}^{m} d_i \tan\left(\sin^{-1}\left(\frac{1}{n_i}\right)\right) + d_{BM} \tan\left(\sin^{-1}\left(\frac{1}{n_{CF}}\right)\right)$$ [Inequality 11]

For example, supposing that, in the structure as shown in FIG. 2, the first and second inorganic encapsulating layers 310 and 330 include silicon oxide and each have a refraction index of 1.46 with respect to 550 nm wavelength light, the organic encapsulating layer 320 includes PET and has a refraction index of 1.65 with respect to 550 nm wavelength light, and the color filter layer 420 includes aluminum oxide and has a refraction index of 1.7 with respect to 550 nm wavelength light. Then, L may be as defined below in Inequality 12, wherein $d_1$ represents a thickness of the first inorganic encapsulating layer 310, $d_2$ represents a thickness of the organic encapsulating layer 320, and $d_3$ represents a thickness of the second inorganic encapsulating layer 330.

$$L \geq 0.94d_1 + 0.76d_2 + 0.94d_3 + 0.73d_{BM}$$ [Inequality 12]

Therefore, when $d_1$ is 1.5 µm, $d_2$ is 2.5 µm, $d_3$ is 1 µm, and $d_{BM}$ is 2 µm, L has to be about 5.71 µm to prevent a decrease in light extraction efficiency.

Figure 3:
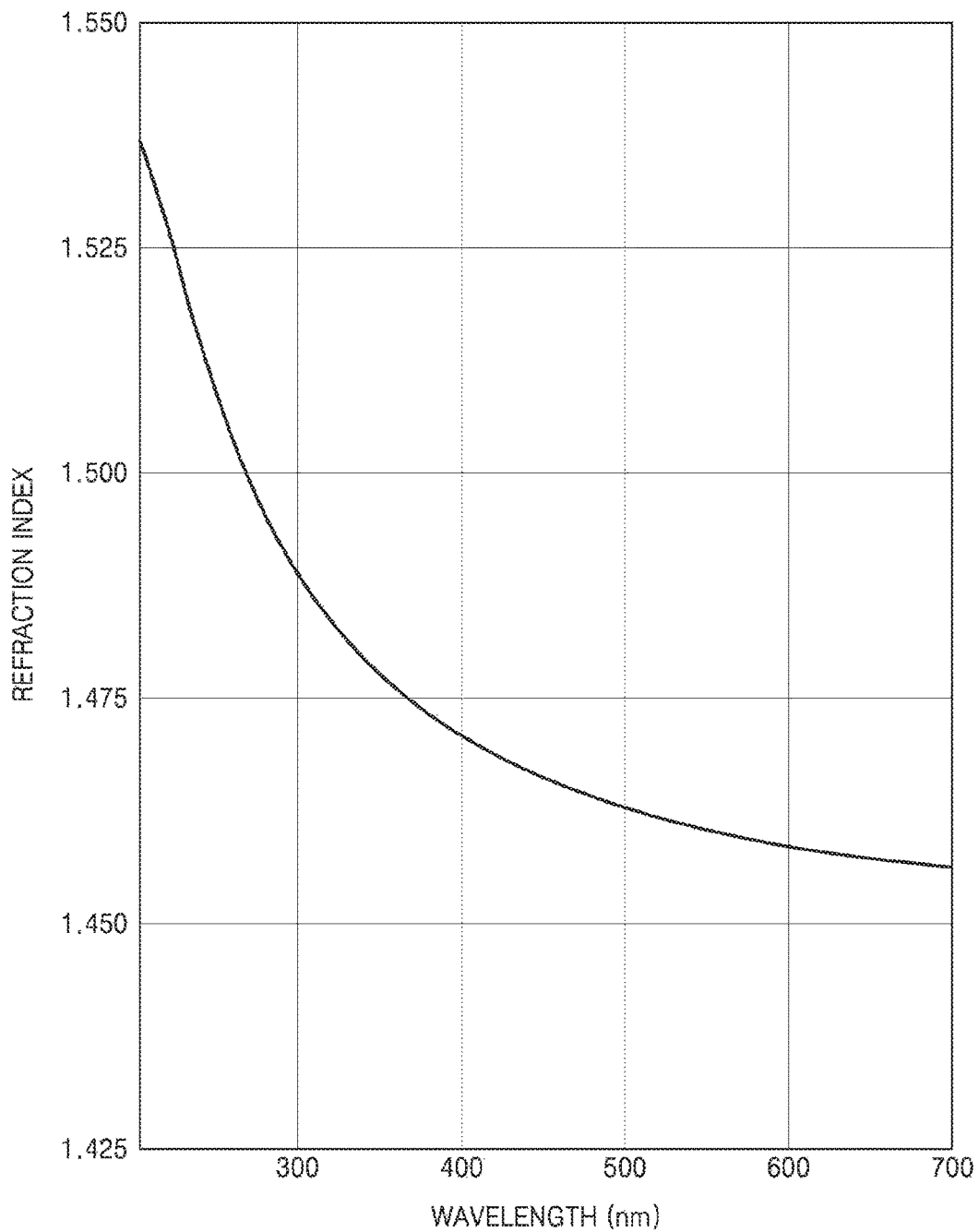
FIG. 3 is a graph of a refraction index according to wavelengths of silicon oxide.
Figure 4:
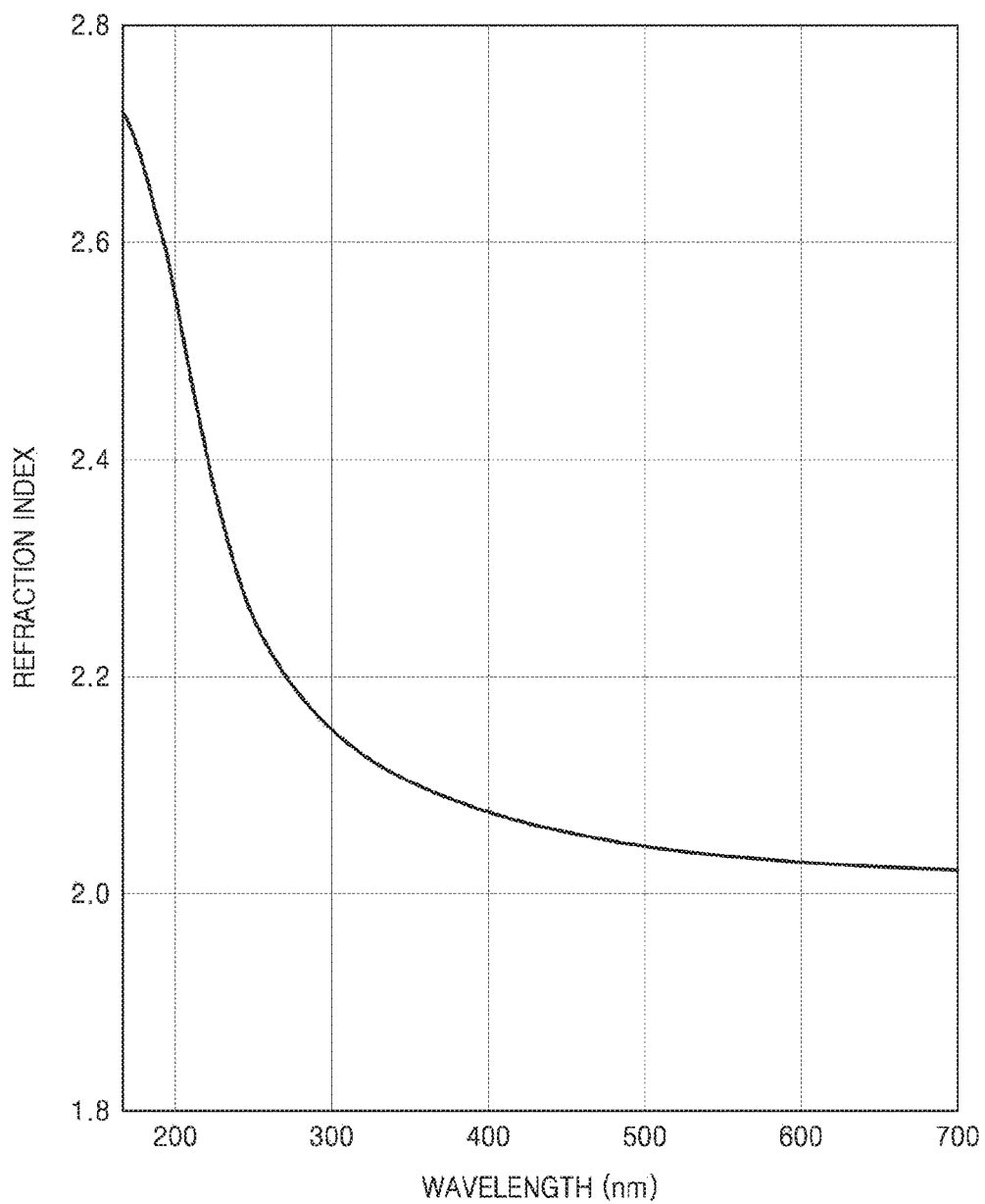
FIG. 4 is a graph of a refraction index according to wavelengths of silicon nitride.
Figure 5:
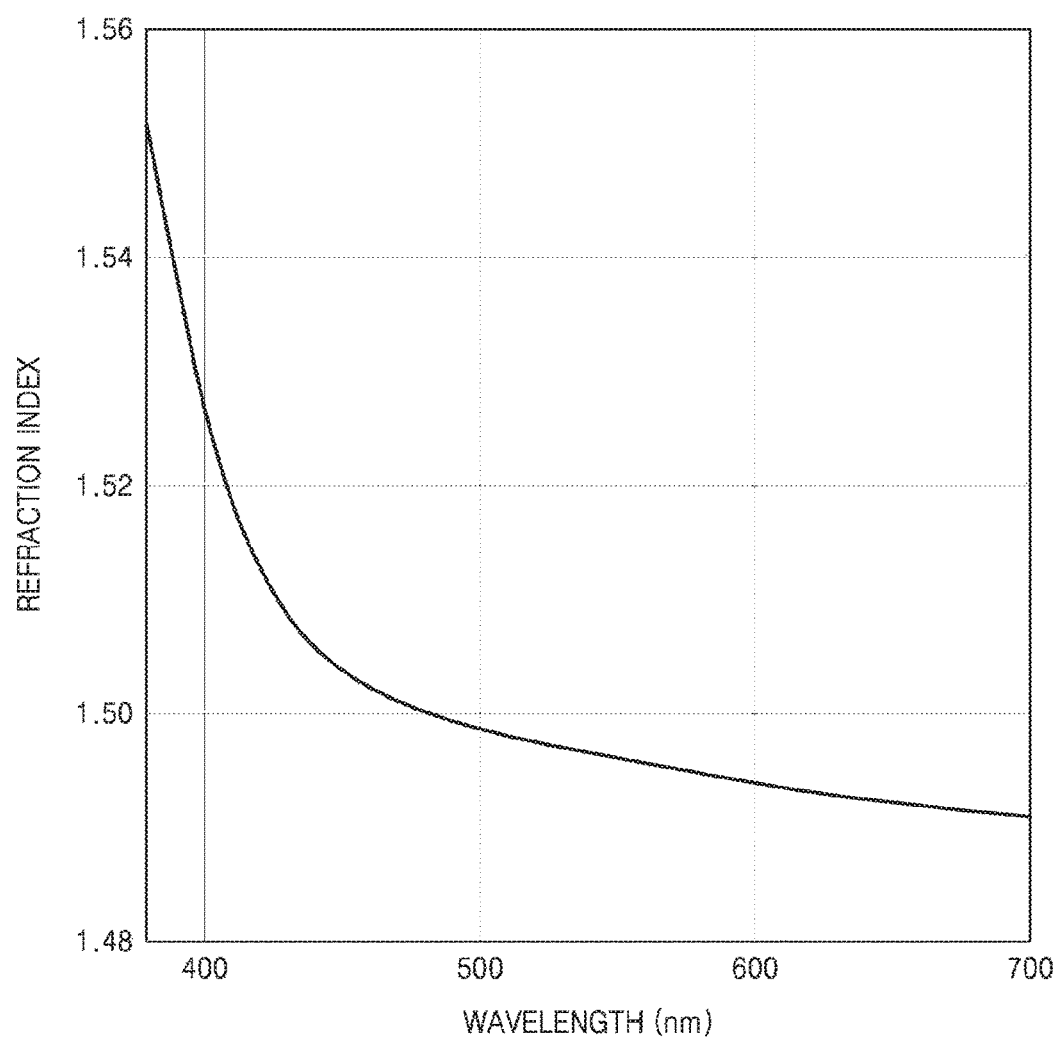
FIG. 5 is a graph of a refraction index according to wavelengths of polyacrylate.
Figure 6:
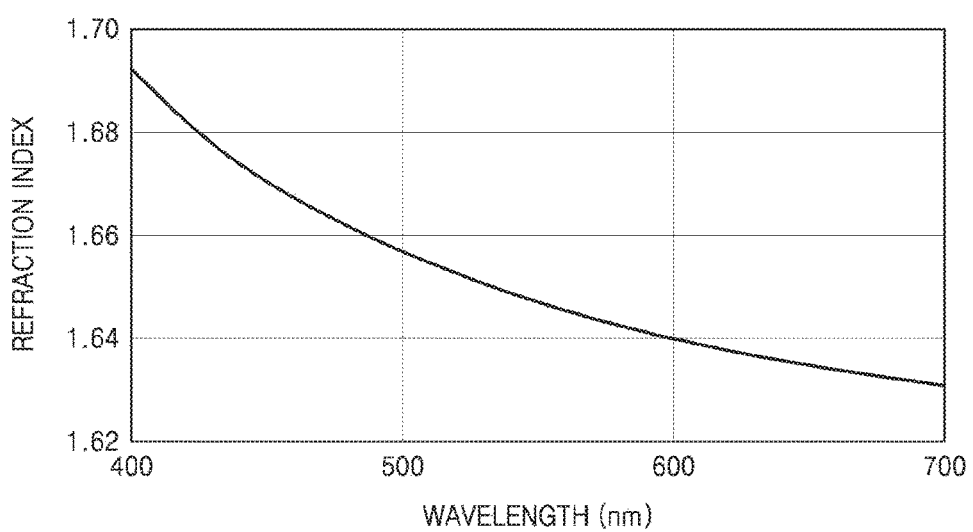
FIG. 6 is a graph of a refraction index according to wavelengths of polyethylene terephthalate.

An inorganic encapsulating layer and an organic encapsulating layer may have different refraction indices according to wavelengths. FIG. 3 is a graph of a refraction index according to wavelengths of silicon oxide, and FIG. 4 is a graph of a refraction index according to wavelengths of silicon nitride. As shown in FIGS. 3 and 4, the refraction index of the inorganic encapsulating layer may vary according to wavelengths. FIG. 5 is a graph of a refraction index according to wavelengths of polyacrylate, and FIG. 6 is a graph of a refraction index according to wavelengths of PET. As shown in FIGS. 5 and 6, the refraction index of the organic encapsulating layer may vary according to wavelengths. This also applies to color filter layers.

Therefore, when an organic light-emitting display apparatus includes a red sub-pixel, a blue sub-pixel, and a green sub-pixel, a minimum value of L that satisfies Inequality 9 may vary in each of the sub-pixels. Referring to FIGS. 3 to 6, in the case of silicon oxide, silicon nitride, polyacrylate, and PET, the refraction index may decrease as the wavelength increases. Based on the wavelength dependence of the refraction index in Inequality 9 or 11, the minimum value of L increases as the wavelength increases. Therefore, the green sub-pixel has a greater minimum value of L than the blue sub-pixel, and the red sub-pixel has a greater minimum value of L than the green sub-pixel. In embodiments, however, the distance L may be limited to an amount such that a portion of light-shielding layer 410 may be sufficiently formed between two immediately neighboring sub-pixels, although the invention is not limited thereto.

By generalizing above embodiments, an organic light-emitting display apparatus according to the following embodiment is also within the scope of the present inventive concept.

Figure 7:
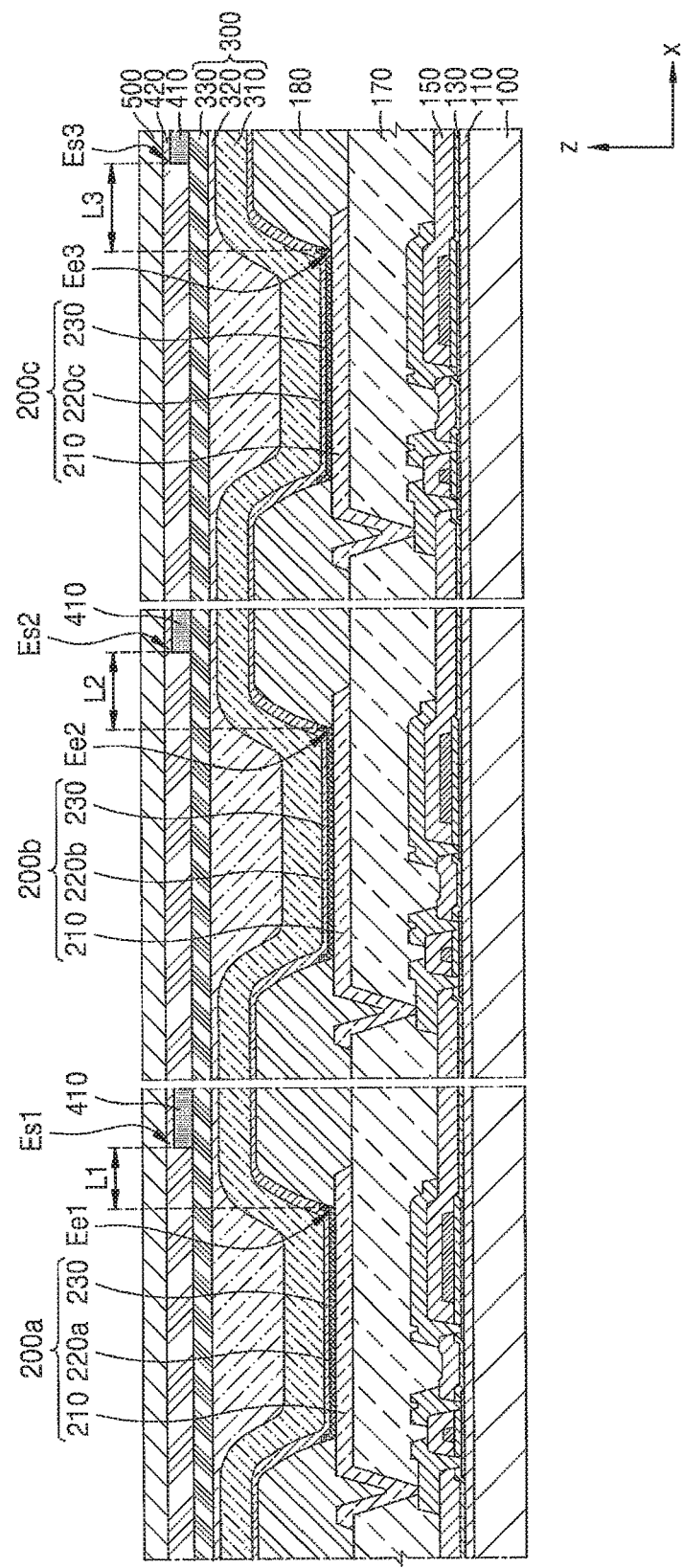

In embodiments, as shown in FIG. 7, the organic light-emitting display apparatus according to the present embodiment includes an array of pixels, each of which includes first to third sub-pixels 200a, 200b and 200c, an encapsulating layer 330 on the first to third sub-pixels 200a-200c, a light-shielding layer 410 on the encapsulating layer 330 and corresponding to areas between the first to third sub-pixels 200a-200c, and a color filter layer 420 on the encapsulating layer 330. The first sub-pixel 200a includes a first light emission layer 220a emitting first light having wavelength belonging to a first wavelength band, the second sub-pixel 200b includes a second light emission layer 220b emitting second light having wavelength belonging to a second wavelength band, and the third sub-pixel 200c includes a third light emission layer 220c emitting third light having wavelength belonging to a third wavelength band. Here, the wavelength of the second light is longer than wavelength of light belonging to the first wavelength band, and the wavelength of the third light is longer than wavelength of light belonging to the second wavelength band. For example, the first wavelength band may be 400-500 nm, the second wavelength band may be 500-600 nm, and the third wavelength band may be 600-1000 nm. FIG. 7 shows L1 that represents a distance between an edge Ee1 of an emission area of the first light emission layer 220a and a first edge Es1 of the light-shielding layer 410 which defines a first hole of the light-shielding layer 410 and surrounds the emission area of the first light emission layer 220a when viewed along z-axis which may extend in a thickness direction of the apparatus (or when viewed in a viewing direction perpendicular to a major surface of the substrate 100). FIG. 7 also shows L2 that represents a distance between an edge Ee2 of an emission area of the second light emission layer 220b and a second edge Es2 of the light-shielding layer 410 which defines a second hole of the light-shielding layer 410 and surrounds the emission area of the second light emission layer 220b when viewed along z-axis (or when viewed in the viewing direction perpendicular to the major surface of the substrate 100). FIG. 7 further shows L3 that represents a distance between an edge Ee3 of an emission area of the third light emission layer 220c and a third edge Es3 of the light-shielding layer 410 which defines a third hole of the light-shielding layer 410 and surrounds the emission area of the third light emission layer 220c when viewed along z-axis (or when viewed in the viewing direction perpendicular to the major surface of the substrate 100). Then, as described above, based on the wavelength dependence of the refraction index in Inequality 9 or 11, L1<L2<L3 (see FIG. 7). Thus, extraction efficiency of light generated by each of the first to third light emission layers 220a-220c may be substantially increased.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
an array of pixels disposed over a substrate, each pixel comprising:
a first sub-pixel comprising a first light emission layer configured to emit first light having a first wavelength within a first wavelength range;
a second sub-pixel comprising a second light emission layer configured to emit second light having a second wavelength within a second wavelength range, the second wavelength of the second light being longer than a wavelength of light within the first wavelength range; and
a third sub-pixel comprising a third light emission layer configured to emit third light having a third wavelength within a third wavelength range, the third wavelength of the third light being longer than a wavelength of light within the second wavelength range;
an encapsulating layer disposed over the first to third sub-pixels;
a light-shielding layer disposed over the encapsulating layer; and
a color filter layer disposed on the encapsulating layer,
wherein L1<L2<L3 is satisfied when L1 represents a distance between an edge of an emission area of the first light emission layer and a first edge of the light-shielding layer when viewed in a viewing direction perpendicular to a major surface of the substrate, L2 represents a distance between an edge of an emission area of the second light emission layer and a second edge of the light-shielding layer when viewed in the viewing direction perpendicular to the major surface of the substrate, and L3 represents a distance between an edge of an emission area of the third light emission layer and a third edge of the light-shielding layer when viewed in the viewing direction perpendicular to the major surface of the substrate.

2. The organic light-emitting display apparatus of claim 1, wherein the first edge of the light-shielding layer defines an opening through which light emitted from the first light emission layer travels, and wherein the distance L1 is determined such that substantially the entire amount of the light emitted from the first light emission layer toward the encapsulation layer travels through the opening.

3. The organic light-emitting display apparatus of claim 1, wherein the first edge forms a first closed loop surrounding the emission area of the first light emission layer, wherein the second edge forms a second closed loop surrounding the emission area of the second light emission layer, and wherein the third edge forms a third closed loop surrounding the emission area of the third light emission layer.

* * * * *